(12) United States Patent
Klein et al.

(10) Patent No.: US 12,026,434 B2
(45) Date of Patent: Jul. 2, 2024

(54) METHOD AND APPARATUS FOR PROVIDING AN UPDATED DIGITAL BUILDING MODEL

(71) Applicant: Siemens Schweiz AG, Zürich (CH)

(72) Inventors: Wolfram Klein, Neubiberg (DE); Christian Frey, Unterägeri (CH); Hermann Georg Mayer, Prien am Chiemsee (DE)

(73) Assignee: Siemens Schweiz AG, Zürich (CH)

( * ) Notice: Subject to any disclaimer, the term of this patent is extended or adjusted under 35 U.S.C. 154(b) by 228 days.

(21) Appl. No.: 16/662,103

(22) Filed: Oct. 24, 2019

(65) Prior Publication Data
US 2020/0143003 A1    May 7, 2020

(30) Foreign Application Priority Data
Nov. 6, 2018  (EP) .................... 18204591

(51) Int. Cl.
*G06F 30/13*     (2020.01)
*G06T 19/00*     (2011.01)

(52) U.S. Cl.
CPC ............ *G06F 30/13* (2020.01); *G06T 19/003* (2013.01)

(58) Field of Classification Search
CPC ....... G06F 30/13; G06T 19/006; G06T 19/20; G06T 19/003
See application file for complete search history.

(56) References Cited

U.S. PATENT DOCUMENTS

| | | | |
|---|---|---|---|
| 7,567,844 B2* | 7/2009 | Thomas .................. | G05B 15/02 715/740 |
| 8,838,376 B2* | 9/2014 | Garin ...................... | H04W 4/33 701/409 |
| 8,965,741 B2* | 2/2015 | McCulloch .............. | G06G 7/48 703/6 |

(Continued)

OTHER PUBLICATIONS

Qing Xiong et al: "A Dynamic Indoor Field Model for Emergency Evacuation Simulation", ISPRS International Journal of Geo-I N Formati On, vol. 6, No. 4, pp. 104, XP055585707, ISSN: 2220-9964, DOI: 10.3390/ijgi6040104 Abstract, pp. 2, paragraph 4,6; figures 1,3, part 3.1.2, 4.1; table 2, part 5, 5.3; figures 7, 8, 12, 17; the whole document; 2017.

(Continued)

*Primary Examiner* — Alvin H Tan
(74) *Attorney, Agent, or Firm* — Schmeiser, Olsen & Watts LLP

(57) ABSTRACT

A method for providing an updated digital building model is provided. The method includes the following steps: a) providing a digital building model for a physical building, b) ascertaining a virtually accessible area within the digital building model, c) capturing real data obtained by a number N of data sources, where N≥1, wherein the real data include data from a real accessible area within the physical building that corresponds to the virtually accessible area, and d) updating the virtually accessible area within the digital building model by the captured real data of the real accessible area to provide the updated digital building model. This means that when there is a need to evacuate a physical building, there are updated virtually accessible areas present, and hence these can be taken as a basis for providing an updated evacuation plan for evacuating people.

17 Claims, 1 Drawing Sheet

(56) References Cited

U.S. PATENT DOCUMENTS

| | | | | |
|---|---|---|---|---|
| 9,589,065 | B2* | 3/2017 | Bhagwan | G06F 16/951 |
| 10,916,066 | B2* | 2/2021 | Skidmore | G10L 15/22 |
| 10,929,575 | B2* | 2/2021 | Tocher | G06T 17/00 |
| 11,069,145 | B1* | 7/2021 | Pearson | G06F 3/011 |
| 2005/0128212 | A1* | 6/2005 | Edecker | G06T 15/04 |
| | | | | 345/582 |
| 2009/0005140 | A1* | 1/2009 | Rose | A63F 13/216 |
| | | | | 463/40 |
| 2014/0100746 | A1* | 4/2014 | Wilde | G01C 21/3697 |
| | | | | 701/1 |
| 2014/0279385 | A1* | 9/2014 | Sogorka | G06Q 40/025 |
| | | | | 705/38 |
| 2014/0280230 | A1* | 9/2014 | Masato | G06F 16/487 |
| | | | | 707/749 |
| 2016/0253842 | A1* | 9/2016 | Shapira | G06T 19/006 |
| | | | | 345/633 |
| 2020/0273325 | A1* | 8/2020 | Ueno | G08G 1/0116 |

OTHER PUBLICATIONS

Hornung Armin et al: "OctoMap: an efficient probabilistic 3D mapping framework based on octrees", Autonomous Robots, vol. 34, No. 3, pp. 189-206, XP055147395, ISSN: 0929-5593, DOI: 10.1007/s10514-012-9321-0; abstract, pp. 2, lefzt column, last paragraph—right column, paragraph 1, part 3, first paragraph; figure 4, part 3.2, in particular last paragraph S.5; part 3.5.1; figure 5; part 5.2; figure 0-13; the whole document; 2013.

Xiong Qing et al: "Free multi-floor indoor space extraction from complex 3D building models", Earth Science Informatics, Springer Berlin Heidelberg, Berlin/Heidelberg, vol. 10, No. 1, pp. 69-83, XP036163968, ISSN: 1865-0473, DOI: 10.1007/S12145-016-0279-X; [gefunden am Nov. 25, 2016]; abstract, pp. 70, right column, paragraph 2; pp. 71, left column, paragraph 2; figures 1-2, part "Conclusions"; figures 20-21 ; the whole document; 2016.

Griffioen, Simon et al: "Exploring indoor movement patterns through eduroam connected wireless devices"; May 7, 2017 (May 7, 2017); XP055822237; Gefunden [am Jul. 7, 2021] im Internet: URL:https://agileonline.org/conference_paper/cds/agile_2017/shortpapers/131_ShortPaper_in_PDF.pdf.

Carlo Ratit et al: "Mobile Landscapes: Using Location Data from Gell Phones for Urban Analysis University City chongqing View project"; Sep. 1, 2006 (Sep. 1, 2006); XP055822238; DOI: 10.1068/b32047; Gefunden [am Jul. 7, 2021] im Internet: URL:https://www.researchgate.net/profile/Dennis-Frenchman/publication/23541565_Mobile_Landscapes_Using_Location_Data_from_Cell_Phones_for_Urban_Analysis/links/0deec53b9ebf278f58000000/Mobile-LandscapesUsing-Location-Data-from-Cell-Phones-for-Urban-Analysis.pdf.

EP Examination Report dated Jul. 15, 2021 for Application No. 18 204 591.4.

Robertson, Patrick et al: "Simultaneous localization and mapping for pedestrians using only foot-mounted inertial sensors"; Ubiquitous Computing, ACM, 2 Penn Plaza, Suite 701 New York NY 10121-0701 USA; published: Sep. 30, 2009; pp. 93-96; XP058125204; DOI: 10.1145/1620545.1620560; ISBN: 978-1-60558-431-7.

Kleiner, Alexander et al: "Mapping disaster areas jointly: RFIDCoordinated SLAM by Humans and Robots", Safety, Security and Rescue Robotics, 2007. SSRR 2007. IEEE International Workshop on, IEEE, PI, Sep. 1, 2007 (Sep. 1, 2007), Seiten 1-6, XP031159618, ISBN: 978-1-4244-1568-7.

Schäfer Martin Straub et al: "Pedestrian Indoor Navigation Using a Wireless Pocket-IMU and User-augmented Maps", Proceedings of the 2nd ACM SIGCOMM Workshop on Networking, Systems, and Applications for Mobile Handhelds, MobiHeld, New Delhi, India. 2010, Aug. 30, 2010 (Aug. 30, 2010), XP93060715, URL:https://mediatum.ub.tum.de/doc/1092585/873014.pdf.

* cited by examiner

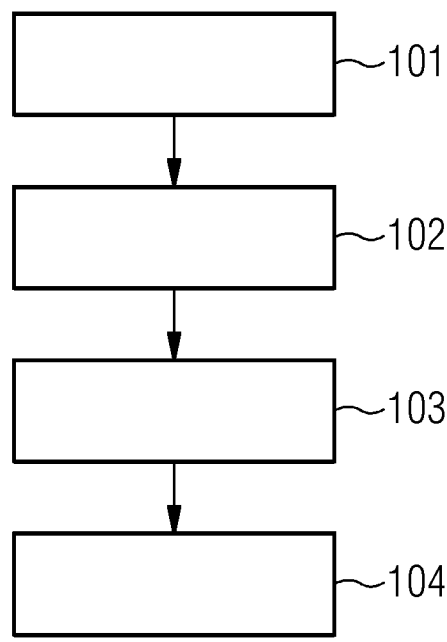
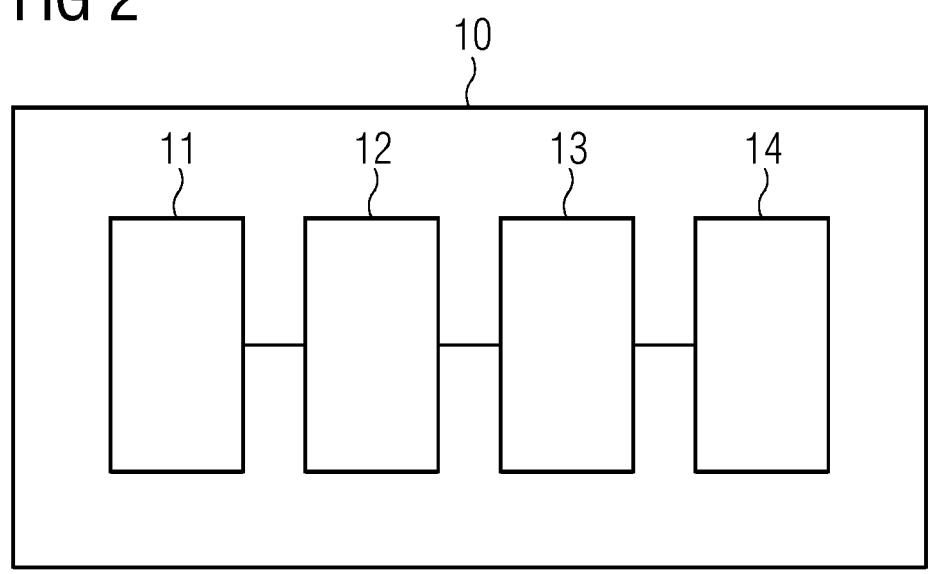

METHOD AND APPARATUS FOR PROVIDING AN UPDATED DIGITAL BUILDING MODEL

CROSS-REFERENCE TO RELATED APPLICATIONS

This application claims priority to European Application No. 18204591.4, having a filing date of Nov. 6, 2018, the entire contents of which are hereby incorporated by reference.

FIELD OF TECHNOLOGY

The following relates to a method and a computer program product for providing an updated digital building model. In addition, the following relates to an apparatus for providing an updated digital building model.

BACKGROUND

The technical field of embodiments of the invention relates to the provision of an updated digital building model, in particular to the provision of updated virtually accessible areas within the updated digital building model.

Physical buildings to be built today are digitally modeled, in particular by architects, by means of "computer aided design" (CAD) tools in order to obtain a digital building model of the physical building to be built.

The digital building model obtained in this manner is converted, in particular by means of "Building Information Modeling" (BIM), into the associated data format for describing BIM, namely "Industry Foundation Classes" (IFC), or else into a manufacturer-specific format such as the Revit format. The resultant BIM/IFC data are therefore used to create a digital model of the physical building to be built, in particular before building begins. The digital model, that is to say the digital building model in BIM/IFC data, is described as what is known as a digital twin in this case.

Digital building models of this kind are used in particular to simulate and examine a person stream flow behavior in a physical building to be built and/or in an existing physical building. When simulating the person stream flow behavior, it is advantageous that the virtually accessible areas of the digital building model are concordant as far as possible with the real accessible areas of the physical building. The accessible areas are for example rooms, hallways, passageways, staircases and elevators. The more up-to-date and more exact the data of the virtually accessible areas in regard to the corresponding real accessible areas, the better the person stream flow behavior can be simulated and examined.

Structural alterations to the physical building means that the status of the BIM/IFC data of the digital building model can be out of date. It is also possible that virtually accessible areas or the accessibility of individual virtually accessible areas have not been recorded exactly during the creation of the digital building model. Furthermore, although there may be accessible areas in the digital building model, they are in reality blocked to people without special authorization (no-go areas, such as in particular in airports). For these reasons, the virtually accessible areas can no longer be concordant with the real accessible areas.

In order to achieve as high a level of concordance as possible nevertheless, at least two options are known from the known art.

A first option is for manual reading of virtually accessible areas to be used to attempt to achieve a high level of concordance. In this case, for example data about and between two digital stories are read from the BIM/IFC data in order to be able to digitally construct a staircase completely. In this case, it is assumed that the BIM/IFC data of the digital building model are consistent with the real data of the physical building. This methodology can be semantically incorrect, for example, and the BIM/IFC data of the digital building model can be out of date.

A second option is for manual access and measurement of the physical building to be performed by people in situ, which in turn entails a high time and cost involvement.

SUMMARY

An aspect relates to a database for a digital building model that leads to an improved updated digital building model.

In accordance with a first aspect, a method for providing an updated digital building model is proposed. In this case, the method comprises the following steps:

a) providing a digital building model for a physical building,
b) ascertaining a virtually accessible area within the digital building model,
c) capturing real data obtained by means of a number N of data sources, where N≥1, wherein the real data comprise data from a real accessible area within the physical building that corresponds to the virtually accessible area, and
d) updating the virtually accessible area within the digital building model by means of the captured real data of the real accessible area to provide the updated digital building model.

Following performance of the claimed method, the updated digital building model has updated virtually accessible areas. The updating of the virtually accessible areas means that for example out-of-date virtually accessible areas that are no longer in the updated digital building model, for example, because they are also no longer in the physical building, are depicted as obstacles or as non-virtually-accessible areas in the updated virtually accessible areas. Based on the updated digital building model, an updated person stream simulation can be performed, the result of which is compared with an earlier person stream simulation performed before the update of the digital building model.

If a difference in the virtually accessible areas now arises between the earlier person stream simulation and the updated person stream simulation or exceeds a predetermined value, a safety warning is delivered to the institution responsible for the physical building. This difference comes about in particular as a result of altered real accessible areas in the physical building. This leads to appropriate measures to ensure safety in the physical building being able to be taken as a precaution based on the safety warning.

This has the advantage that when there is a need to evacuate a physical building, there are updated virtually accessible areas present, and hence these can be taken as a basis for providing an updated evacuation plan for evacuating people. This increases safety for people in the physical building, since faster and less problematic evacuation of the people can be performed in the event of evacuation.

A further advantage is that virtually accessible areas, such as for example staircases, can be modeled in optimum fashion only by including the captured real data. This allows further simulation models to be adapted to the current situation and hence improved.

The providing comprises in particular a building digitally modeled by means of "computer aided design" (CAD) tools, which building is in the form of a digital building model. Furthermore, the providing next comprises a conversion of the digital building model in particular into a "Building Information Modeling" (BIM)/"Industry Foundation Classes" (IFC) format, into BIM/IFC data. The digital building model can be provided in particular for a physical building that is yet to be built and/or for a physical building that is already built.

The physical building can also be referred to as a real building.

The virtually accessible area can be referred to in particular as a digital accessible area.

Real data are data and/or data records that are obtained in particular by means of one or more data sources. Data sources comprise information that is obtained in particular from real accessible areas and/or the physical building and/or from building parts of the physical building.

The updating comprises the captured real data, in particular the real data from the real accessible areas, being merged with the digital building model, in particular with the virtually accessible areas. In detail, the update of the digital building model is consistent in particular with a data fusion, that is to say a data merging, of the captured real data from the physical building, on the one hand, with the earlier virtually accessible areas within the digital building model, on the other hand, in order to provide an updated digital building model as the result of the data fusion.

The claimed method can in particular also be useful for improving energy simulation models and/or interior light simulation models. Further simulation models, such as for example acoustic simulations, are conceivable.

In accordance with one embodiment, the virtually accessible area of the digital building model is ascertained from the digital building model by means of digital planning data, and/or is ascertained from the physical building by means of a scanning process that involves the real accessible area within the physical building being scanned, and/or is ascertained from the physical building by means of at least one mobile data source that provides movement data from at least one user of the real accessible area within the physical building.

The ascertaining comprises in particular extracting the desired virtually accessible areas within the digital building model from the digital building model by means of different methods described in this embodiment.

The digital planning data are for example data that can be extracted and/or obtained from a digital building model. Digital planning data are for example in the BIM format, IFC format, and/or in the manufacturer-specific Revit(Autodesk) format. The digital planning data comprise in particular the virtually accessible areas of the digital building model.

In particular, a digital building model described by means of IFC contains object classes such as "IFC Slabs", which represent a story of a digital building, "IFC Stairs", which digitally represent the staircases, and "IFC Walls", which digitally represent the walls and/or obstacles. These three IFC elements can be used for example to ascertain the virtually accessible areas from the digital planning data for use for the digital building model.

The scanning process involves in particular laser scanners, such as for example a robot with a laser scanner, being used to scan the real accessible and real non-accessible areas of the physical building, such as for example floors, walls, doors, staircases and/or elevators. The physical building is subsequently digitally stored as a point cloud. Other scanning processes and scanning devices are conceivable. Further software processes can subsequently be used to extract information relating to the real accessible areas from the point cloud. Therefore, in particular information about which points of the point cloud represent a wall, the floor, the staircase and/or the elevator is obtained.

The mobile data source denotes in particular a source that obtains its mobile data by means of a mobile terminal, such as for example a smartphone, a tablet and/or a portable electronic device. Provided that a user carries the device and the user moves within the physical building and recording of mobile data on the mobile terminal is activated, this mobile terminal is used to record mobile data.

Mobile data comprise in particular data that are obtained by means of different mobile sensors installed on and/or in the mobile terminal. Mobile sensors comprise for example a camera sensor system, acceleration sensor system and/or an installation of a mobile sensor, for example in a cleaning cart moved in the physical building. Further mobile sensors in a mobile terminal are conceivable. Additionally, mobile data comprise in particular data for which one or more mobile radio masts, a GPS sensor system and/or GLONASS sensor system and/or other satellite systems or position determination systems are used to determine a movement profile and/or position data of the user of the mobile terminal in the event of movement within the physical building. These likewise include in particular indoor position processes based on beacons installed in the physical building or WLAN connections between a mobile terminal and a router installed in the physical building, for example in order to be able to create movement profiles of the user.

In accordance with a further embodiment, each of the N data sources is in the form of a specific data source type, wherein the specific data source type comprises the mobile data source or an installed data source.

The installed data source denotes in particular a source that obtains its installed data by means of an installed sensor system, in particular installed sensors.

The installed sensors comprise sensors that are in subassemblies and/or devices installed or fitted in physical buildings. The installed sensors include for example video cameras, window sensors, door sensors, sensors integrated in a building control engineering system, fire doors, entry controls. Further sensors installed and/or integrated within a physical building are conceivable.

In accordance with a further embodiment, the number N of data sources is N≥2.

In accordance with a further embodiment, each of the N data sources is assigned a respective priority, wherein at least one of the N data sources is selected to capture the real data on the basis of the assigned priorities.

In accordance with a further embodiment, the priority used is a temporal priority to indicate an up-to-dateness of the real data obtained from the data source, wherein at least one of the N data sources is selected to capture the real data on the basis of the assigned temporal priorities.

The temporal priority involves the time stamp of the data generation being evaluated and compared from all N data sources, in particular. In particular, the N data sources having the most up-to-date creation time have the highest priority, since they represent an actual state of the physical building in the most up-to-date fashion. These N data sources are therefore used for further processing. The use of temporal priority has the advantage that the N most up-todate data sources are used for capturing the real data in each case. This leads to an improved updated digital building model.

In accordance with a further embodiment, the priority used is an accuracy priority to indicate an accuracy of the real data obtained from the data source, wherein at least one of the N data sources is selected to capture the real data on the basis of the assigned accuracy priorities.

An accuracy priority involves in particular that data source from at least two data sources, such as for example two cameras, that is to say that camera, from which the accuracy of the data is highest being used. The accuracy of the data of a video camera involves determining which video camera portrays a real accessible area more exactly. This leads to an improved updated digital building model.

In accordance with a further embodiment, the priority used is a data source type priority to indicate a data source type of the real data obtained from the data source, wherein at least one of the N data sources is selected to capture the real data on the basis of the assigned data source type priorities.

The data source type priority involves in particular at least two data sources being compared with one another, wherein for example one data source type is a mobile data source and one data type is an installed data source. In this case, a comparison is used to ascertain which of the at least two data types have a higher accuracy in respect of capturing the real accessible area of the physical building. The data source type having the higher accuracy is used to capture the real data. By way of example, installed data from a video camera can be more exact than mobile data of a portable terminal. Accordingly, in this case, the data of the video camera are used as data source for capturing real data. This leads to an improved updated digital building model.

In accordance with a further embodiment, a combination of at least two priorities is selected from the priorities to capture the real data, wherein the priorities comprise the temporal priority, the accuracy priority and the data source type priority.

The combination involves at least in particular two priorities for capturing the real data being selected. By way of example, the data source or data sources is/are selected that have the highest accuracy for the temporal priority. Subsequently, the data source or data sources is/are used that have the highest accuracy for the accuracy priority. In particular, the most up-to-date data source or data sources of the temporal priority is/are then combined with for example the data source or data sources that has/have the highest accuracy.

This leads to an improved updated digital building model. The combination can comprise for example two, three, four or more priorities and/or data sources.

In accordance with a further embodiment, a frequency of use of mobile data sources to capture the real data from at least one of the real accessible areas within the physical building is obtained in order to update at least one of the virtually accessible areas within the digital building model by means of the captured real data.

The frequency of use of mobile data sources denotes in particular an absolute frequency. The absolute frequency is significant in the event of fast evacuation of people from the physical building and/or for creating updated evacuation plans for physical buildings by means of the updated digital building model.

The frequency denotes in particular an absolute frequency with which for example a multiplicity of users having mobile terminals, for example 40 users, for which in particular the movement data and/or position data are recorded, move and/or have moved over a specific real accessible area.

The frequency therefore indicates how often a user or the multiplicity of users has/have moved over a specific real accessible area, in particular hallways, staircases and/or rooms, within a specific period of time, such as for example one week or one month. By way of example, multiple real accessible areas, such as hallways, are compared. In particular that hallway from a multiplicity of hallways within the physical building over which the most users move or have moved therefore has the highest frequency and is therefore used as preferred data source.

As a result, it is possible to deduce which accessible areas are familiar to the users and/or which accessible areas are used by the users.

This has the advantage that the evacuation simulation can be improved, since the familiar paths used by the user or by the multiplicity of users are known. This improves the evacuation situation in the event of an evacuation and therefore increases the safety of the user and/or users in the physical building. In particular, when the familiar paths are used it is possible to examine whether the familiar paths are not overloaded in the event of an evacuation, since for example a multiplicity of people use only the familiar paths. Additionally, the mobile data sources are used to provide an improved, updated digital building model.

In accordance with a further embodiment, the digital building model is in the form of a digital building model having multiple individual buildings that are not connected to one another and/or in the form of a digital building model having multiple buildings that are connected to one another and/or in the form of a digital campus and/or city map.

In accordance with a further embodiment, the accessible area is in the form of a hallway and/or in the form of a corridor and/or in the form of a room and/or in the form of a staircase and/or in the form of an elevator and/or in the form of a specific building part of the digital building model and/or of the physical building and/or in the form of a path and/or a road and/or a space between at least two digital buildings of the digital building model and/or between at least two physical buildings.

In particular, the accessible area is in the form of a path and/or a road, wherein the path and/or the road can be arranged within a physical campus, for example, and connects at least two physical buildings to one another. The path and/or the road is arranged within the digital campus map and connects at least two digital buildings from the digital campus map.

In order in particular to update the virtually accessible areas within the digital building model, that is to say for example the physical contours and/or a number of steps in a staircase, by means of captured real data as exactly as possible, various options for the individual types of accessible areas are described in detail below.

In particular, multiple instances of the N data sources and multiple instances of the data source types are used for updating the virtually accessible areas, such as for example hallways, staircases, elevators and rooms, in order to use them to obtain real data from the real physical building for update purposes.

In respect of the exact depiction of the digital hallways, it is advantageous to ascertain the respective width of the real hallways. This involves the BIM/IFC data in regard to the digital hallways being extracted from the available digital building model, in particular. Said data are merged with the captured real data from the mobile data sources and the installed data sources of the real hallways, in particular. The merging allows in particular the depiction of the digital hallways to be approximated by means of the combination with the BIM/IFC data. In order to improve this approximation further, in particular a multiplicity of mobile and/or installed data sources are included. This leads to an improved updated digital building model, in particular of the virtually accessible areas such as the digital hallways.

In respect of the digital staircases and digital elevators, it is advantageous to ascertain the precise number of real steps and the precise number of real stories that the real elevator serves.

This involves in particular the BIM/IFC data in regard to the digital staircases and digital elevators being extracted from the available digital building model. These extracted BIM/IFC data are merged with the captured real data from one or more of the scanning processes already presented for real accessible areas, in particular for real staircases and elevators. In detail, this involves the entry and exit points of the users on a respective story being determined from the captured real data. This allows precisely how many steps a staircase comprises, how wide a step in a staircase is and/or which stories include an elevator to be deduced, in particular. This merging leads to an improved updated digital building model, in particular of the virtually accessible areas, such as the digital staircases and elevators.

In respect of the digital rooms, it is advantageous to ascertain the precise doors and openings of the real rooms. This involves in particular the BIM/IFC data in regard to the digital rooms and the door information thereof, in particular from an object class "IfcDoor", which door information indicates the width of the door and a state regarding whether the door is open or closed, for example, being extracted from the available digital building model. These extracted BIM/IFC data are merged with the captured real data from one or more of the scanning processes already presented for the real accessible rooms.

In detail, the entry point or points into the respective digital room are determined from the captured real data in this case, since doors and openings are for the most part modeled incompletely in the BIM/IFC model, but the digital room is modeled approximately exactly in the BIM/IFC model. This merging leads to an improved updated digital building model, in particular of the virtually accessible areas such as the digital rooms.

In accordance with a further embodiment, the method comprises the following steps:
  e) performing an updated person stream simulation based on the updated digital building model,
  f) comparing virtually accessible areas of an earlier person stream simulation with the virtually accessible areas of the updated person stream simulation, and
  g) delivering a safety warning on the basis of a difference between the virtually accessible areas of the earlier person stream simulation and the virtually accessible areas of the updated person stream simulation.

In accordance with a second aspect, a computer program product (non-transitory computer readable storage medium having instructions, which when executed by a processor, perform actions) is proposed that prompts the performance of the method as explained above on a program-controlled device.

A computer program product, such as e.g. a computer program means, can be provided or supplied for example as a storage medium, such as e.g. a memory card, USB stick, CD ROM, DVD, or else in the form of a downloadable file from a server in a network. This can be effected for example in a wireless communication network by means of the transfer of an appropriate file having the computer program product or the computer program means.

In accordance with a third aspect, an apparatus for providing an updated digital building model is proposed. The apparatus comprises a providing unit configured to provide a digital building model for a physical building, an ascertainment unit configured to ascertain a virtually accessible area within the digital building model, a capture unit configured to capture real data obtained by means of a number N of data sources, where N≥1, wherein the real data comprise data from a real accessible area within the physical building that corresponds to the virtually accessible area, and an update unit configured to update the virtually accessible area within the digital building model by means of the captured real data of the real accessible area in order to provide the updated digital building model.

The respective unit, for example the capture unit or the update unit, can be implemented in hardware and/or else in software. In the case of a hardware implementation, the respective unit can be in the form of an apparatus or in the form of part of an apparatus, for example in the form of a computer or in the form of a microprocessor or in the form of a control computer of a vehicle. In the case of a software implementation, the respective unit can be in the form of a computer program product, in the form of a function, in the form of a routine, in the form of part of a program code or in the form of an executable object.

The embodiments and features described for the proposed method apply to the proposed apparatus accordingly.

Further possible implementations of embodiments of the invention also comprise combinations of features or embodiments described above or below for the exemplary embodiments that are not explicitly mentioned. In this case, a person skilled in the art will also add individual aspects as improvements or additions to the respective basic form of embodiments of the invention.

BRIEF DESCRIPTION

Some of the embodiments will be described in detail, with reference to the following figures, wherein like designations denote like members, wherein:

FIG. 1 shows a schematic flowchart for an exemplary embodiment of a method for providing an updated digital building model; and FIG. 2 shows a schematic block diagram of an exemplary embodiment of an apparatus for providing an updated digital building model.

DETAILED DESCRIPTION

FIG. 1 shows a schematic flowchart for an exemplary embodiment of a method for providing an updated digital building model.

The exemplary embodiment of FIG. 1 comprises the following method steps 101 to 104:

Step 101 involves a digital building model being provided for a physical building.

The digital building model is in particular in the form of a digital building model having multiple individual buildings that are not connected to one another and/or in the form of a digital building model having multiple buildings that are connected to one another and/or in the form of part of a digital city map.

Step 102 involves a virtually accessible area within the digital building model being ascertained.

The accessible area is in particular in the form of a hallway and/or in the form of a corridor and/or in the form of a room and/or in the form of a staircase and/or in the form of an elevator and/or in the form of a specific building part of the digital building model and/or of the physical building and/or in the form of a path and/or a road and/or a space between at least two digital buildings of the digital building model and/or between at least two physical buildings.

The virtually accessible area of the digital building model is in particular ascertained from the digital building model by means of digital planning data, and/or is ascertained from the physical building by means of a scanning process that involves the real accessible area within the physical building being scanned, and/or is ascertained from the physical building by means of at least one mobile data source that provides movement data from at least one user of the real accessible area within the physical building.

Step 103 involves real data being captured that are obtained by means of a number N of data sources, where N≥1, wherein the real data comprise data from a real accessible area within the physical building that corresponds to the virtually accessible area.

Each of the N data sources is in particular in the form of a specific data source type, wherein the specific data source type comprises the mobile data source or an installed data source.

The number N of data sources is N≥2.

Each of the N data sources is in particular assigned a respective priority, wherein at least one of the N data sources is selected to capture the real data on the basis of the assigned priorities.

In particular, the priority used is a temporal priority to indicate an up-to-dateness of the real data obtained from the data source, wherein at least one of the N data sources is selected to capture the real data on the basis of the assigned temporal priorities.

The priority used is an accuracy priority to indicate an accuracy of the real data obtained from the data source, wherein at least one of the N data sources is selected to capture the real data on the basis of the assigned accuracy priorities.

In particular, the priority used is a data source type priority to indicate a data source type of the real data obtained from the data source, wherein at least one of the N data sources is selected to capture the real data on the basis of the assigned data source type priorities.

A combination of at least two priorities is selected from the priorities to capture the real data, wherein the priorities comprise the temporal priority, the accuracy priority and the data source type priority.

Step 104 involves the virtually accessible area within the digital building model being updated by means of the captured real data of the real accessible area in order to provide the updated digital building model.

In particular, a frequency of use of mobile data sources to capture the real data from at least one of the real accessible areas within the physical building is obtained in order to update at least one of the virtually accessible areas within the digital building model by means of the captured real data.

FIG. 2 shows a schematic block diagram of an exemplary embodiment of an apparatus 10 for providing an updated digital building model. The apparatus 10 comprises a providing unit 11, an ascertainment unit 12, a capture unit 13 and an update unit 14.

The providing unit 11 is configured to provide a digital building model for a physical building.

The ascertainment unit 12 is configured to ascertain a virtually accessible area within the digital building model.

The capture unit 13 is configured to capture real data obtained by means of a number N of data sources, where N≥1, wherein the real data comprise data from a real accessible area within the physical building that corresponds to the virtually accessible area.

The update unit 14 is configured to update the virtually accessible area within the digital building model by means of the captured real data of the real accessible area in order to provide the updated digital building model.

Although the present invention has been disclosed in the form of preferred embodiments and variations thereon, it will be understood that numerous additional modifications and variations could be made thereto without departing from the scope of the intention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A method for providing an updated digital building model, having the steps of:
   a) providing a digital building model for a physical building,
   b) ascertaining a virtually accessible area within the digital building model, wherein the virtually accessible area is automatically ascertained from the physical building by a plurality of mobile data sources of a plurality of users, wherein each respective mobile data source of the plurality of mobile data sources provides movement data of the respective user within a real accessible area of the physical building,
   c) capturing real data obtained by means of a selected number N of data sources, where N ≥1, wherein the real data comprise data from the real accessible area of the physical building that corresponds to the virtually accessible area and wherein at least one of the N data sources is selected based on a specific area of multiple areas within the real accessible area having a highest frequency of use of the plurality of mobile data sources within the real accessible area of the physical building, wherein the highest frequency of use of the plurality of mobile data sources within the real accessible area of the physical building is based on how often the plurality of users have moved over the multiple areas within the real accessible area of the physical building within a period of time, and wherein the captured real data is from the specific area, and
   d) updating the virtually accessible area within the digital building model by the captured real data to provide the updated digital building model for the physical building, wherein updating includes merging the captured real data with the digital building model.

2. The method as claimed in claim 1, wherein the N data sources further include a video camera, a window sensor, a door sensor, a sensor integrated in a building control engineering system, a fire door, and/or an entry control.

3. The method as claimed in claim 1, wherein each of the N data sources is in the form of a specif is data source type, wherein the specific data source type comprises a mobile data source and an installed data source.

4. The method as claimed in claim 3, wherein each respective mobile data source of the plurality of mobile data sources provides movement profiles of the respective user.

5. The method as claimed in claim 1, wherein the number N of data sources is N≥2.

6. The method as claimed in claim 5, wherein each of the N data sources is assigned a respective priority, wherein at least one of the N data sources is selected to capture the real data on the basis of the assigned priorities.

7. The method as claimed in claim 6, wherein the priority used is a temporal priority to indicate an up-to-dateness of the real data obtained from the data source, wherein at least one of the N data sources is selected to capture the real data on the basis of the assigned temporal priorities.

8. The method as claimed in claim 6, wherein the priority used is an accuracy priority to indicate an accuracy of the real data obtained from the data source, wherein at least one of the N data sources is selected to capture the real data on the basis of the assigned accuracy priorities.

9. The method as claimed in claim 6, wherein the priority used is a data source type priority to indicate a data source type of the real data obtained from the data source, wherein at least one of the N data sources is selected to capture the real data on the basis of the assigned data source type priorities.

10. The method as claimed in claim 6, wherein a combination of at least two priorities is selected from the priorities to capture the real data, wherein the priorities comprise the temporal priority, the accuracy priority and the data source type priority.

11. The method as claimed in claim 1, wherein the digital building model is in at least one of the form of a digital building model having multiple individual buildings that are not connected to one another, a digital building model having multiple buildings that are connected to one another, a digital campus and city map.

12. The method as claimed in claim 1, wherein the real accessible area is in the form of a hallway and/or in the form of a corridor and/or in the form of at least one of a room, a staircase, an elevator, a specific building part of the digital building model, the physical building, or a path.

13. The method as claimed in claim 1, wherein the method further comprises the steps of:
 e) performing an updated person stream simulation based on the updated digital building model,
 f) comparing virtually accessible areas of an earlier person stream simulation with the virtually accessible areas of the updated person stream simulation, and
 g) delivering a safety warning on the basis of a difference between the virtually accessible areas of the earlier person stream simulation and the virtually accessible areas of the updated person stream simulation.

14. A computer program product, comprising a computer readable hardware storage device having computer readable program code stored therein, said program code executable by a processor of a computer system to implement the method as claimed in claim 1.

15. The method as claimed in claim 1, wherein the highest frequency of use is used to update and/or select a path in the digital building model.

16. An apparatus for providing an updated digital building model, having:
 a providing unit configured to provide a digital building model for a physical building,
 an ascertainment unit configured to ascertain a virtually accessible area within the digital building model, wherein the virtually accessible area is automatically ascertained from the physical building by a plurality of mobile data sources of a plurality of users, wherein each respective mobile data source of the plurality of mobile data sources provides movement data of a respective user of the real accessible area within the physical building,
 a capture unit configured to capture real data obtained by means of a selected number N of data sources, where N≥1, wherein the real data comprise data from a real accessible area within the physical building that corresponds to the virtually accessible area and wherein at least one of the N data sources is selected based on a specific area of multiple areas within the real accessible area having a highest frequency of use of the plurality of mobile data sources within the real accessible area within the physical building, wherein the highest frequency of use of the plurality of mobile data sources within the real accessible area within the physical building is based on how often the plurality of users have moved over the multiple areas within the real accessible area within the physical building within a period of time, and wherein the captured real data is from the specific area, and
 an update unit configured to update the virtually accessible area within the digital building model by means of the captured real data in order to provide the updated digital building model for the physical building, wherein updating includes merging the captured real data with the digital building model.

17. The apparatus as claimed in claim 16, wherein the highest frequency of use is used to update and/or select a path in the digital building model.

* * * * *